US006188088B1

United States Patent
Ramakrishnan

(10) Patent No.: US 6,188,088 B1
(45) Date of Patent: Feb. 13, 2001

(54) ELECTROSTATIC DISCHARGE PROTECTION FOR ANALOG SWITCHES

(75) Inventor: Shankar Ramakrishnan, Cupertino, CA (US)

(73) Assignee: Maxim Integrated Products, Inc., Sunnyvale, CA (US)

( * ) Notice: Under 35 U.S.C. 154(b), the term of this patent shall be extended for 0 days.

(21) Appl. No.: 09/349,291

(22) Filed: Jul. 8, 1999

(51) Int. Cl.[7] .................................................. H01L 29/72
(52) U.S. Cl. ......................... 257/173; 257/146; 257/357
(58) Field of Search ................................. 257/124, 125, 257/146, 173, 357; 361/91.5, 91.8

(56) References Cited

U.S. PATENT DOCUMENTS

| 4,484,244 | | 11/1984 | Avery . | |
|---|---|---|---|---|
| 4,890,012 | | 12/1989 | Stockinger . | |
| 5,400,202 | * | 3/1995 | Metz et al. | 361/56 |
| 5,572,394 | * | 11/1996 | Ker et al. | 361/56 |
| 5,576,557 | * | 11/1996 | Ker et al. | 257/173 |
| 5,666,082 | | 9/1997 | Wilenken et al. . | |
| 5,742,085 | * | 4/1998 | Yu | 257/360 |
| 5,905,288 | * | 5/1999 | Ker | 257/355 |
| 6,008,684 | * | 12/1999 | Ker et al. | 327/428 |
| 6,011,681 | * | 1/2000 | Ker et al. | 361/111 |
| 6,016,002 | * | 1/2000 | Chen et al. | 257/546 |

FOREIGN PATENT DOCUMENTS

| 0772274 | * | 5/1997 | (EP) . |
| 2182491 | | 5/1987 | (GB) . |
| 10-294425 | * | 11/1998 | (JP) . |
| 11-204737 | * | 7/1999 | (JP) . |

* cited by examiner

*Primary Examiner*—David Hardy
(74) *Attorney, Agent, or Firm*—Blakely, Sokoloff, Taylor & Zafman LLP

(57) ABSTRACT

Electrostatic discharge protection for analog switches using silicon-controlled rectifiers. Two silicon-controlled rectifiers (SCRs) may be formed in a common isolation region of an integrated circuit. Each SCR has its gate and cathode coupled together so as to be self triggering. The SCRs are connected in parallel in reverse polarity and coupled between the analog switch input or output and ground. In normal switch operation, both SCRs will be off, though when the voltage of the protected switch connection exceed on of the supply rails, one of the SCRs will trigger, providing a low impedance connection to ground. Once the voltage returns to normal, the SCR will automatically release.

10 Claims, 1 Drawing Sheet

ELECTROSTATIC DISCHARGE PROTECTION FOR ANALOG SWITCHES

BACKGROUND OF THE INVENTION

1. Field of the Invention

The present invention relates to the field of electrostatic protection of electronic devices.

2. Prior Art

Field effect devices, now more generally referred to as MOS devices, are characterized by an insulated gate over a channel region extending between doped source and drain regions. The gate insulation is a relatively thin oxide layer which, together with the relatively small gate, forms a capacitor of low capacitance and low breakdown voltage, usually approximately on the order of 10 volts. However, a typical electrostatic discharge as may occur when handling the device or associated circuitry in dry weather may easily reach 1,000 volts or more. Without electrostatic discharge protection, gate oxides will break down in a destructive manner when subjected to such high voltages, even from a relatively high impedance source, rendering the circuit permanently inoperative. As a result, various circuit designs and techniques have been used in the prior art to provide protection of MOS type integrated circuits, with various standardized testing procedures being used to verify satisfactory electrostatic discharge survival. By way of example, the IEC 1000-4-2 model requires electrostatic discharge protection for voltage spikes up to 15,000 volts, the voltage spike being delivered through a resistor of a predetermined value.

BRIEF SUMMARY OF THE INVENTION

Electrostatic discharge protection for analog switches using silicon-controlled rectifiers is disclosed. Two silicon-controlled rectifiers (SCRs) may be formed in a common isolation region of an integrated circuit. Each SCR has its gate and cathode coupled together so as to be self triggering. The SCRs are connected in parallel in reverse polarity and coupled between the analog switch input or output and ground. In normal switch operation, both SCRs will be off, though when the voltage of the protected switch connection exceed on of the supply rails, one of the SCRs will trigger, providing a low impedance connection to ground. Once the voltage returns to normal, the SCR will automatically release.

DETAILED DESCRIPTION OF THE PREFERRED EMBODIMENT

Figure 1:
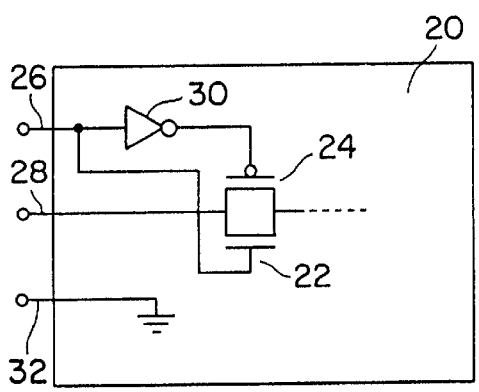
FIG. 1 is a diagram illustrating a bilateral switch on an input for an integrated circuit.

First referring to FIG. 1, a schematic representation of a bilateral switch as may be used on an input of an integrated circuit 20 may be seen. The bilateral switch is comprised of an n-channel MOS transistor 22 and a p-channel MOS transistor 24, connected in parallel and controlled by a switch control signal SW on terminal 26. Since the controls for the n-channel MOS and the p-channel MOS are complimentary signals, typically an inverter 30 is included in one of the gate drive circuits, in the p-channel MOS drive circuit if the switch is to be on with a high switch signal SW, or in the gate drive circuit for the n-channel MOS device if the switch is to be on with a low switch signal SW. Switches of this type, commonly referred to as bilateral or analog switches, controllably couple an input signal on terminal 28 to the circuitry within the integrated circuit 20 (which circuitry is not shown). Also among the various connections to the integrated circuit 20 will be a ground connection, such as on terminal 32. The use of complimentary devices in the switch assures that one of the devices will be on even when the signal approaches either rail.

In the case of circuits using the bilateral switch illustrated in FIG. 1, it is common to use some form of electrostatic discharge protection on the inputs connected to gates of MOS devices, such as terminal 26 in FIG. 1. In that regard, the present invention would similarly use some form of protection for such input. In addition, however, the present invention utilizes silicon controlled rectifier (SCR) protection on the analog switch input itself, as may be seen in FIG. 2. Alternatively, SCR protection may be provided on the switch output if the same is available at an integrated circuit terminal, or on both the input and output if both are externally available. In that regard, since an analog switch of this type is a bilateral device, the switch lead connected to the integrated circuit terminal in FIGS. 1 and 2 may be the switch input (sources of the MOS transistors) or the switch output (drains of the MOS devices). Similarly, the switch control signal may originate off chip as shown, or alternatively may originate on chip.

Figure 2:
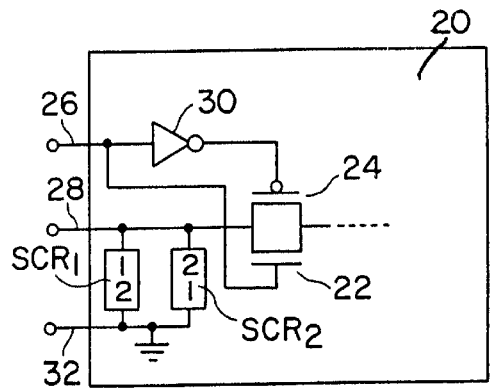
FIG. 2 is a diagram illustrating a bilateral switch on an input for an integrated circuit as in FIG. 1, and further illustrating the present invention as incorporated therewith

FIG. 2 illustrates the connection of two SCRs, $SCR_1$ and $SCR_2$, in parallel between ground and the analog switch input on terminal 28. $SCR_1$ and $SCR_2$ are similar SCRs connected in parallel in opposite polarity, as indicated by the connections 1,2 of the SCRs. These SCRs are each connected so as to be self triggering (the gate of each SCR connected to the associated SCR cathode). Under normal operating circumstances, the SCRs are off and the analog switch functions normally. If however, there is an electrostatic discharge on the protected pin, the voltage will go beyond one of the supply rails and cause one of the SCRs to trigger. The triggered SCR then presents a low impedance path to ground for the discharge surge, and thus protects the switch. The SCR automatically releases when the discharge event is over, after which the switch functions normally again from that point forward.

Figure 3:
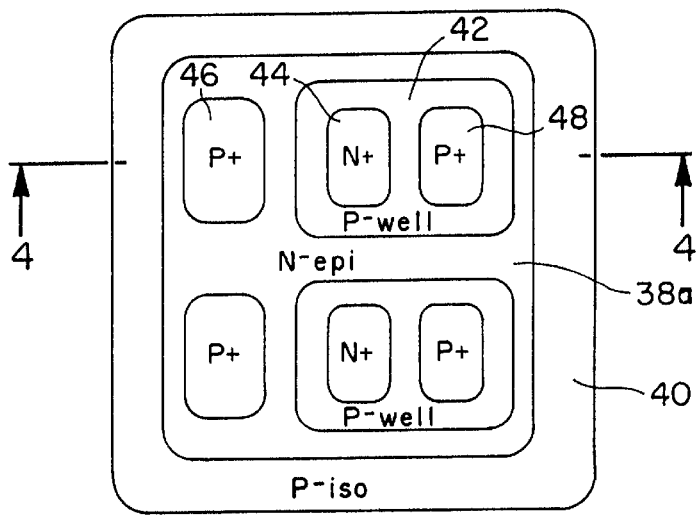
FIG. 3 is a schematic top view of a portion of an integrated circuit showing the two SCRs formed in a common isolation region.
Figure 4:
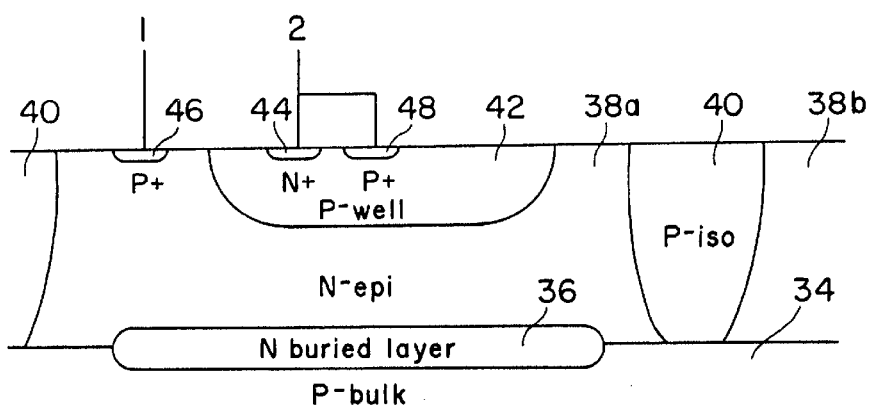
FIG. 4 is a schematic cross section taken along lines 4—4 of FIG. 3.

One implementation for the SCRs is shown in FIGS. 3 and 4. FIG. 3 is a schematic representation of a top view of the various diffused regions forming the silicon controlled rectifiers $SCR_1$ and $SCR_2$ (FIG. 2). FIG. 4 is a cross-section taken along line 4—4 of FIG. 3, schematically showing the vertical extent of the various diffused regions in this exemplary embodiment. For clarity in the Figure, the patterned metallization layers have not been illustrated, though are apparent from the connections forming leads 1 and 2 of each of the SCRs as identified in FIGS. 2 and 4.

In the exemplary embodiment, a p-type substrate 34 is used. An n-doped region 36 formed on the substrate 34 and then an n-type epitaxial region n-epi 38 (n-epitaxial regions 38a and 38b in FIG. 4) is grown over the top of the substrate, burying the n-type layer 36. P-type isolation regions p-iso 40 are provided through the epitaxial layer 38 to electrically isolate the n-type epitaxial region n-epi 38a from the surrounding epitaxial regions 38b. Thereafter, p-well 42 is formed, as is n+ region 44 and p+ regions 46 and 48. The patterned metallization for interconnect purposes, formed in the conventional manner, provides lead 1 electrically connected to the p+ region 46, and lead 2 electrically connected to both the n+ region 44 and the p+ region 48. The p+ region 46, the portion 38a of the epitaxial layer, the p-well 42 and the n+ region 44 provide the typical pnpn structure of a thyristor. The p+ region 48, in turn, provides electrical contact to the p-well 42, forming the gate contact for the silicon controlled rectifier. The common electrical connection of the p+ region 48 and the n+ region 44 makes the silicon controlled rectifier a two terminal, self triggering device.

While the two SCRs, $SCR_1$ and $SCR_2$ (FIG. 2), are connected in opposition, the two SCRs may be formed in the single n-type epitaxial region 38a. In particular, each of the unipolar SCRs trigger when the input voltage across the terminals 1 and 2 exceeds the avalanche breakdown voltage for the pn junction between the p-type well 42 and the n-type epitaxial region 38a. Each SCR will trigger only when pin 1 is positive with respect to pin 2. In the reverse direction, each SCR will not conduct for voltages less than the avalanche breakdown voltage of the pn junction between the p+ region 46 and the n-type epitaxial region 38a.

While the present invention has been disclosed and described with respect to a specific embodiment thereof, it will be understood by those skilled in the art that various changes in form and detail may be made therein without departing from the spirit and scope of the invention.

What is claimed is:

1. An integrated circuit including an analog switch with at least the analog switch input or the analog switch output and a ground connected to external analog switch and ground terminals comprising:
    a p-channel and an n-channel MOS transistor, each having a source, a drain and a gate, the sources of the p-channel and the n-channel MOS transistor being coupled together to form the analog switch input, the drains of the p-channel and the n-channel MOS transistor being coupled together to form the analog switch output, the gates of the p-channel and the n-channel MOS transistor being coupled to complimentary gate control signals;
    a first SCR having an anode, a cathode and an SCR gate, the first SCR having its gate coupled to its cathode and its cathode coupled to the analog switch terminal, the first SCR having its anode coupled to the ground terminal; and,
    a second SCR having an anode, a cathode and an SCR gate, the second SCR having its gate coupled to its cathode and its cathode coupled to the ground terminal, the second SCR having its anode coupled to the analog switch terminal.

2. The integrated circuit of claim 1 wherein the first and second SCRs are formed in a common isolation region in the integrated circuit.

3. The integrated circuit of claim 2 wherein the integrated circuit is formed on a p-type substrate with the common isolation region being an n-epitaxial region.

4. An integrated circuit including an analog switch with an analog switch input and a ground connected to external analog switch input and ground terminals comprising:
    a p-channel and an n-channel MOS transistor, each having a source, a drain and a gate, the sources of the p-channel and the n-channel MOS transistor being coupled together and to the analog switch input, the drains of the p-channel and the n-channel MOS transistor being coupled together and to the analog switch output, the gates of the p-channel and the n-channel MOS transistor being coupled to complimentary gate control signals;
    a first SCR having an anode, a cathode and an SCR gate, the first SCR having its gate coupled to its cathode and its cathode coupled to the analog switch input, the first SCR having its anode coupled to the ground terminal; and,
    a second SCR having an anode, a cathode and an SCR gate, the second SCR having its gate coupled to its cathode and its cathode coupled to the ground terminal, the second SCR having its anode coupled to the analog switch input.

5. The integrated circuit of claim 4 wherein the first and second SCRs are formed in a common isolation region in the integrated circuit.

6. The integrated circuit of claim 5 wherein the integrated circuit is formed on a p-type substrate with the common isolation region being an n-epitaxial region.

7. An integrated circuit including an analog switch with an analog switch output and a ground connected to external analog switch and ground terminals comprising:
    a p-channel and an n-channel MOS transistor, each having a source, a drain and a gate, the sources of the p-channel and the n-channel MOS transistor being coupled together and to the analog switch input, the drains of the p-channel and the n-channel MOS transistor being coupled together and to the analog switch output, the gates of the p-channel and the n-channel MOS transistor being coupled to complimentary gate control signals;
    a first SCR having an anode, a cathode and an SCR gate, the first SCR having its gate coupled to its cathode and its cathode coupled to the analog switch output, the first SCR having its anode coupled to the ground terminal; and,
    a second SCR having an anode, a cathode and an SCR gate, the second SCR having its gate coupled to its cathode and its cathode coupled to the ground terminal, the second SCR having its anode coupled to the analog switch output.

8. The integrated circuit of claim 7 wherein the first and second SCRs are formed in a common isolation region in the integrated circuit.

9. The integrated circuit of claim 8 wherein the integrated circuit is formed on a p-type substrate with the common isolation region being an n-epitaxial region.

10. An analog switch with at least the analog switch input or the analog switch output and a ground connected to external analog switch and ground terminals comprising:
    a p-channel and an n-channel MOS transistor, each having a source, a drain and a gate, the sources of the p-channel and the n-channel MOS transistor being coupled together to form the analog switch input, the drains of the p-channel and the n-channel MOS transistor being coupled together to form the analog switch output, the gates of the p-channel and the n-channel MOS transistor being coupled to complimentary gate control signals;

a first SCR having an anode, a cathode and an SCR gate, the first SCR having its gate coupled to its cathode and its cathode coupled to the analog switch terminal, the first SCR having its anode coupled to the ground terminal; and, a second SCR having an anode, a cathode and an SCR gate, the second SCR having its gate coupled to its cathode and its cathode coupled to the ground terminal, the second SCR having its anode coupled to the analog switch terminal.

\* \* \* \* \*